(12) United States Patent
Blankenship

(10) Patent No.: US 6,980,032 B1
(45) Date of Patent: Dec. 27, 2005

(54) LEVEL TRANSLATOR

(75) Inventor: Timothy Lance Blankenship, Austin, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 18 days.

(21) Appl. No.: 10/694,660

(22) Filed: Oct. 27, 2003

(51) Int. Cl.[7] ......................................... H03K 19/0175
(52) U.S. Cl. ......................... 326/81; 326/83; 326/113; 326/34
(58) Field of Search .............................. 326/62, 63, 68, 326/80, 81, 112, 119, 121, 33, 83, 34; 327/333

(56) References Cited

U.S. PATENT DOCUMENTS

| | | | | |
|---|---|---|---|---|
| 5,465,054 A | * | 11/1995 | Erhart | 326/34 |
| 5,604,449 A | | 2/1997 | Erhart et al. | |
| 6,031,395 A | * | 2/2000 | Choi et al. | 326/83 |
| 6,392,440 B2 | * | 5/2002 | Nebel | 326/81 |

* cited by examiner

Primary Examiner—Vibol Tan
(74) Attorney, Agent, or Firm—Darby & Darby P.C.; Matthew M. Gaffney

(57) ABSTRACT

An input level translator circuit is provided. The translator circuit is configured to convert a full-range signal into a low-range signal and a high-range signal. A first pass transistor is configured to restrict the voltage of the full-range signal to provide a high-range voltage at a high-range node when the full-range signal corresponds to a logic 0. A second pass transistor is configured to restrict the voltage of the full-range signal to provide a low-range voltage at a low-range node when the full-range signal corresponds to a logic 1. A first switch circuit is configured to couple the high-range to a first cascode bias signal when the full-range voltage corresponds to a logic 1. A second switch circuit is configured to couple the low-range node to a second cascode bias signal when the full-range voltage corresponds to a logic 0.

2 Claims, 5 Drawing Sheets

US 6,980,032 B1

LEVEL TRANSLATOR

FIELD OF THE INVENTION

The invention related to voltage level translation. In particular, the invention related to a method and apparatus for converting a signal with a full-range voltage into signals with small voltage-swings.

BACKGROUND OF THE INVENTION

Voltage doubling is a technique that makes it possible to design electrical circuits that operate with high power supply voltages (e.g. 10V or above), while not allowing the Vgs, Vgd, or Vds of the individual transistors in the circuit to exceed a lower value, such as 5V. The voltage doubling technique is often accomplished with cascode transistors.

BRIEF DESCRIPTION OF THE DRAWINGS

Non-limiting and non-exhaustive embodiments of the present invention are described with reference to the following drawings, in which.

DETAILED DESCRIPTION

Figure 1:
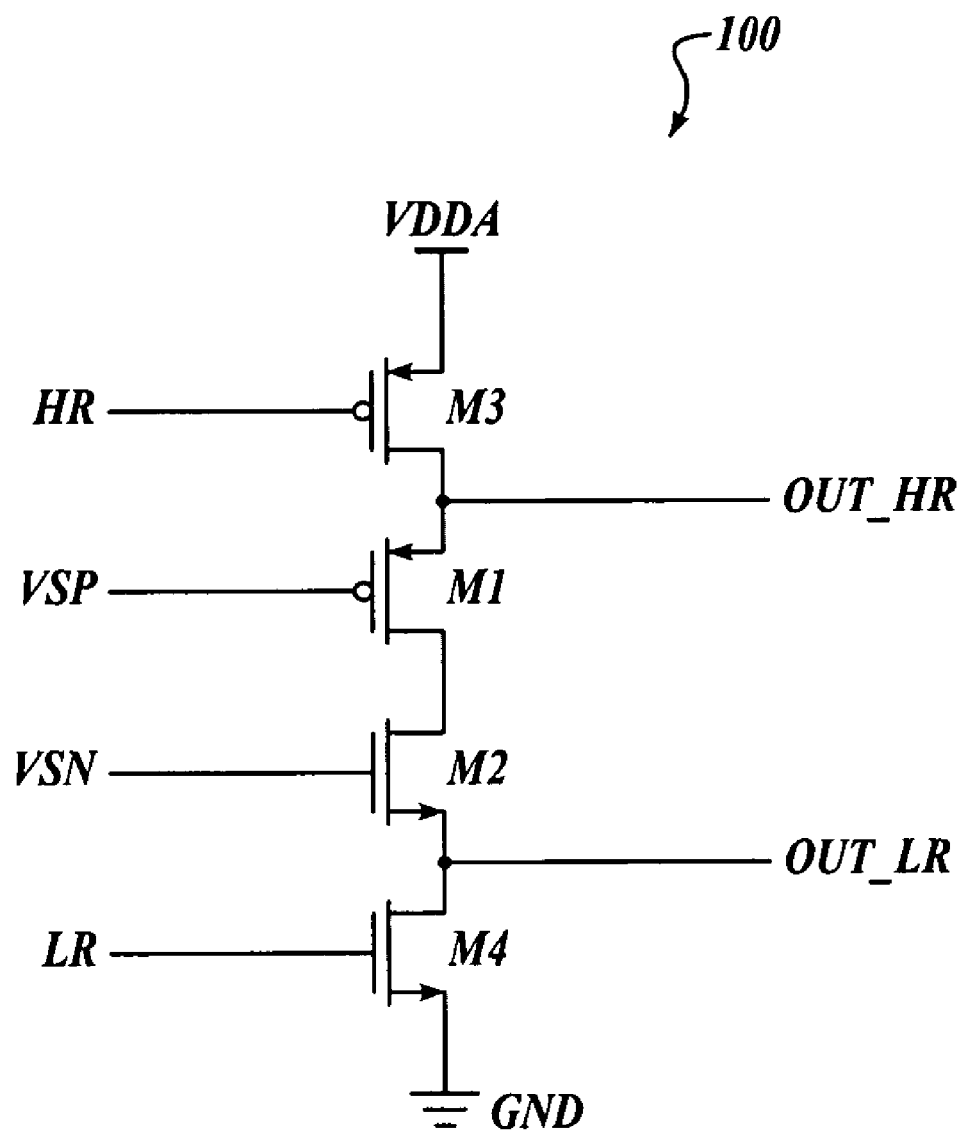
FIG. 1 illustrates a high-voltage inverter that utilizes voltage doubling techniques.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to an input level translator circuit. The input level translator circuit is configured to convert a full-range signal into a low-range signal and a high-range signal. A first pass transistor is configured to restrict the voltage of the full-range signal to provide a high-range voltage at a high-range node when the full-range signal corresponds to a logic 0. A second pass transistor is configured to restrict the voltage of the full-range signal to provide a low-range voltage at a low-range node when the full-range signal corresponds to a logic 1. A first switch circuit is configured to couple the high-range to a first cascode bias signal when the full-range voltage corresponds to a logic 1. A second switch circuit is configured to couple the low-range node to a second cascode bias signal when the full-range voltage corresponds to a logic 0.

Voltage Doubling

FIG. 1 illustrates a high-voltage inverter 100 that utilizes voltage doubling techniques. Inverter 100 includes transistors M1–M4, arranged in a cascade configuration.

In inverter 100, Transistors M1 and M2 are each arranged to operate as cascode transistors. Transistor M1 is configured to receive a first bias signal Vsp at a gate of transistor M1, and transistor M2 is configured to receive a second bias signal Vsn at a gate of transistor M2. Signal Vsp is a cascode bias voltage that is used to bias transistor M1, and signal Vsn is a cascode bias voltage that is used to bias transistor M2. The voltages associated with signals Vsp and Vsn are set by several factors including the power supply voltage, the maximum Vgs, Vgd, and Vds of the process for good long-term reliability, the threshold voltages of the transistors, the junction diode breakdowns of the transistors, and the input voltage swing. Signals Vsp and Vsn are selected such that the maximum Vgs, Vgd, and Vds of the transistors for good long-term reliability are not exceeded.

Transistor M3 is configured to receive a high-range signal hr at the gate of transistor M3, and transistor M4 is configured to receive a low-range signal lr at the gate of transistor M4. Signal lr is bounded between 0 volts and approximately Vdda/2, where Vdda is the voltage associated with the power supply. Signal hr is bounded between Vdda and approximately Vdda/2. Signal hr and signal lr each correspond to substantially the same logic level at approximately the same time. A high-range output signal out_hr is provided at the drain of transistor M3, and a low-range output out_lr is provided at the drain of transistor M4. The logic level of both out_hr and out_lr corresponds to the inverse of the logic level of signals lr and hr. Signals out_hr and out_lr may be used to drive other high-voltage logic circuits.

In general, voltage doubling techniques may be used to extend the operating range to approximately 2X volts, where the underlying process can withstand X volts.

Voltage Doubling Inverters

Figure 2:
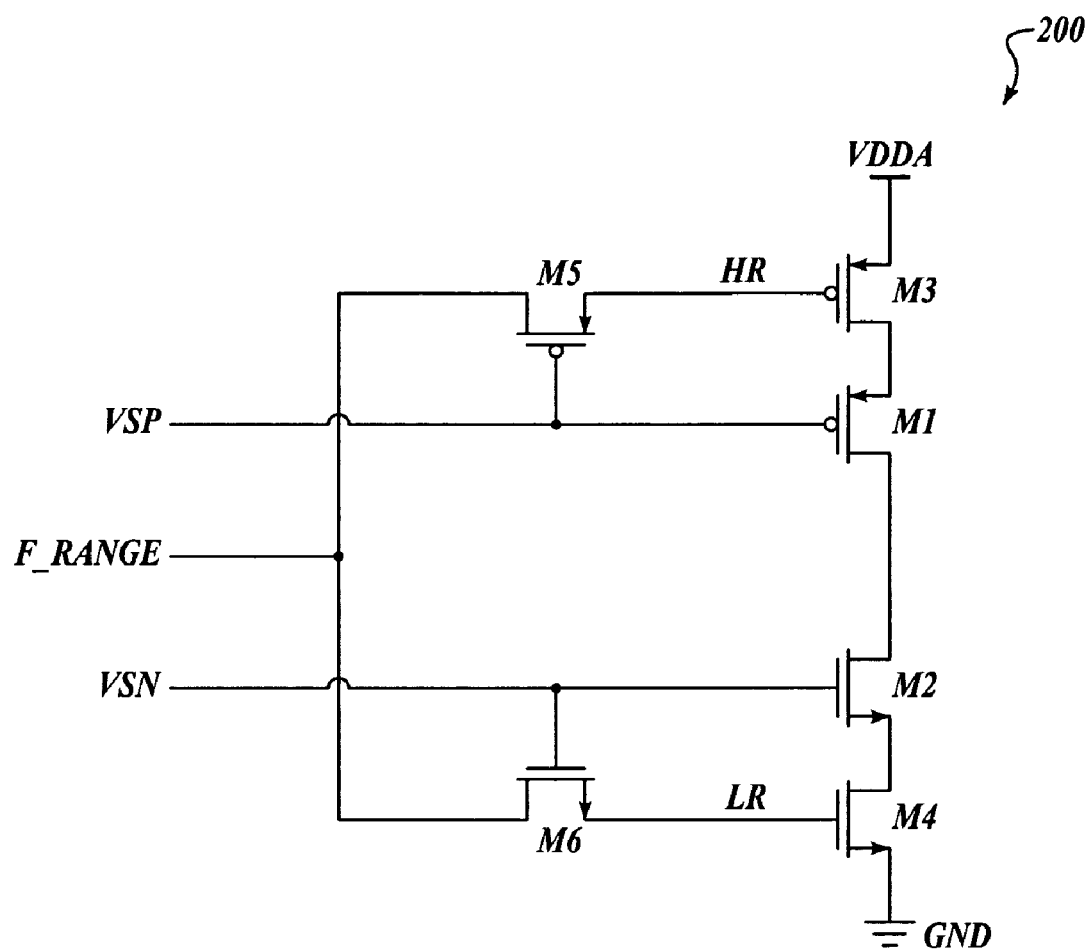
FIG. 2 illustrates a high-voltage inverter circuit.

FIG. 2 illustrates a high-voltage inverter circuit 200. Circuit 200 includes transistors (M1–M6). Transistor M5 is configured to convert a full-range signal f_range into a high-range signal hr by restricting the voltage range associated with signal f_range. M6 is configured to convert the full-range signal f_range into a low-range signal lr by restricting the voltage range associated with signal f_range. The gates of transistors M3 and M4 are each only actively driven during half of a cycle associated with the voltage level of the full range signal.

Charge injection (i.e. capacitive coupling) can be caused as a result of the gate-to-drain capacitance on transistors M3 and M4. The injected charge can cause voltage at the gate of transistors M3 and M4 can move outside of the desired operating range for Vgs, Vds, and Vgd of transistors M3 and M4.

Figure 3:
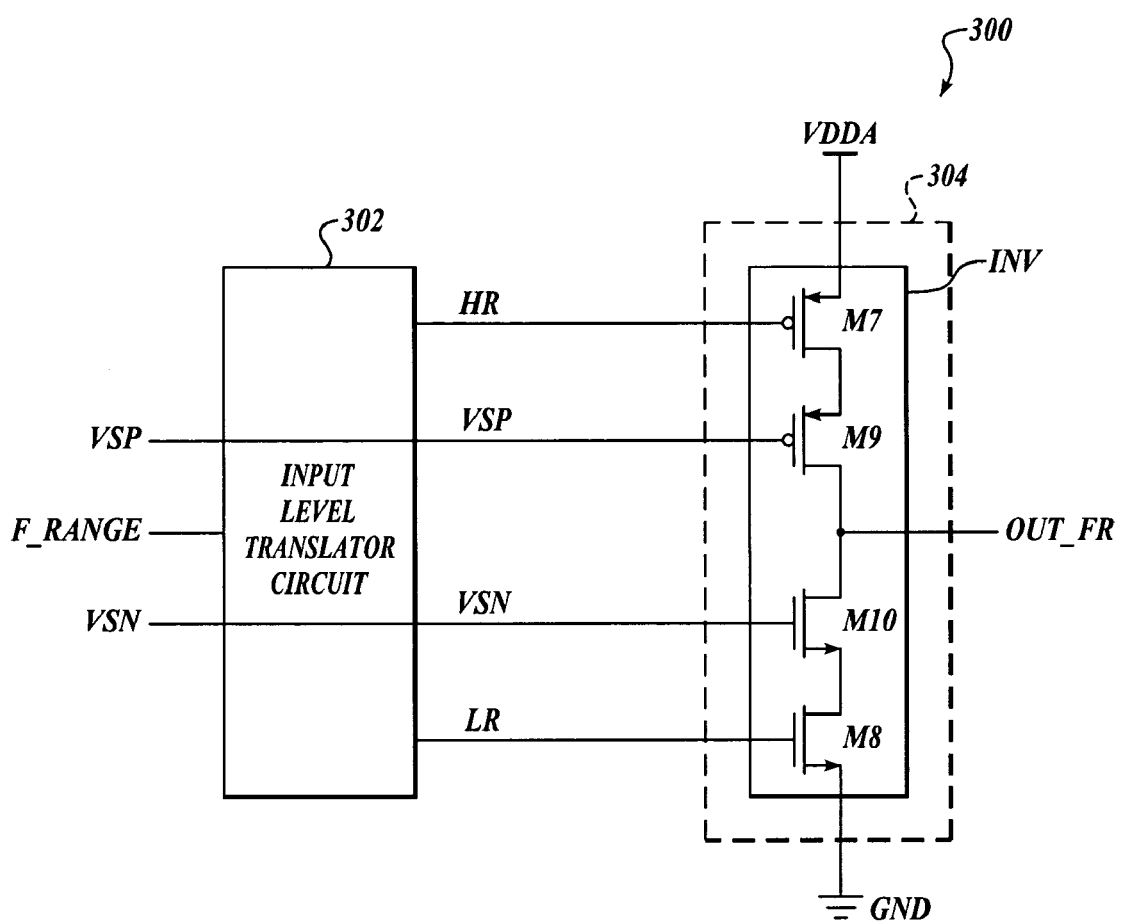
FIG. 3 illustrates an example embodiment of a circuit that is arranged in accordance with aspects of the present invention.

FIG. 3 illustrates an example embodiment of a circuit 300 that is arranged in accordance with aspects of the present invention. Circuit 300 includes an input level translator circuit 302 and a high-voltage logic circuit 304 that utilizes the voltage doubling technique. An example high voltage logic circuit 304 comprises a high-voltage inverter (Inv). An example high-voltage inverter (Inv) comprises transistors M7–M10.

Input level translator circuit 302 is configured to provide a high-range signal hr and a low-range signal lr in response to a full-range signal f_range, a first bias signal Vsp, and a second bias signal Vsn.

Signal f_range is bounded between a ground terminal (gnd) and Vdda, where Vdda is the voltage associated with the power supply signal. Input level translator circuit 302 is configured to provide signal hr such that signal hr is bounded between Vdda and approximately (Vdda/2+Vtp), where Vtp is the threshold voltage for a p-type MOS transistor. Input level translator circuit 302 is further configured to provide signal lr such that signal lr is bounded between gnd and approximately (Vdda/2+Vtp). Input level translator circuit 302 is arranged to provide signals hr and lr such that signals hr and lr each have a logic level that corresponds to the logic level of signal f_range.

High-voltage logic circuit 304 is configured to provide a full-range output signal out_fr in response to signal hr and signal lr. High-voltage logic circuit 304 includes a p-type cascode transistor (e.g. transistor M9) that is configured to receive signal Vsp at a gate of the p-type cascode transistor. High-voltage logic circuit 304 includes an n-type cascode transistor (e.g. transistor M10) that is configured to receive signal Vsn at a gate of the n-type cascode transistor. Transistors M7 and M8 operate in substantially the same manner as discussed in FIG. 1 for transistors M3 and M4, respectively.

Figure 4:
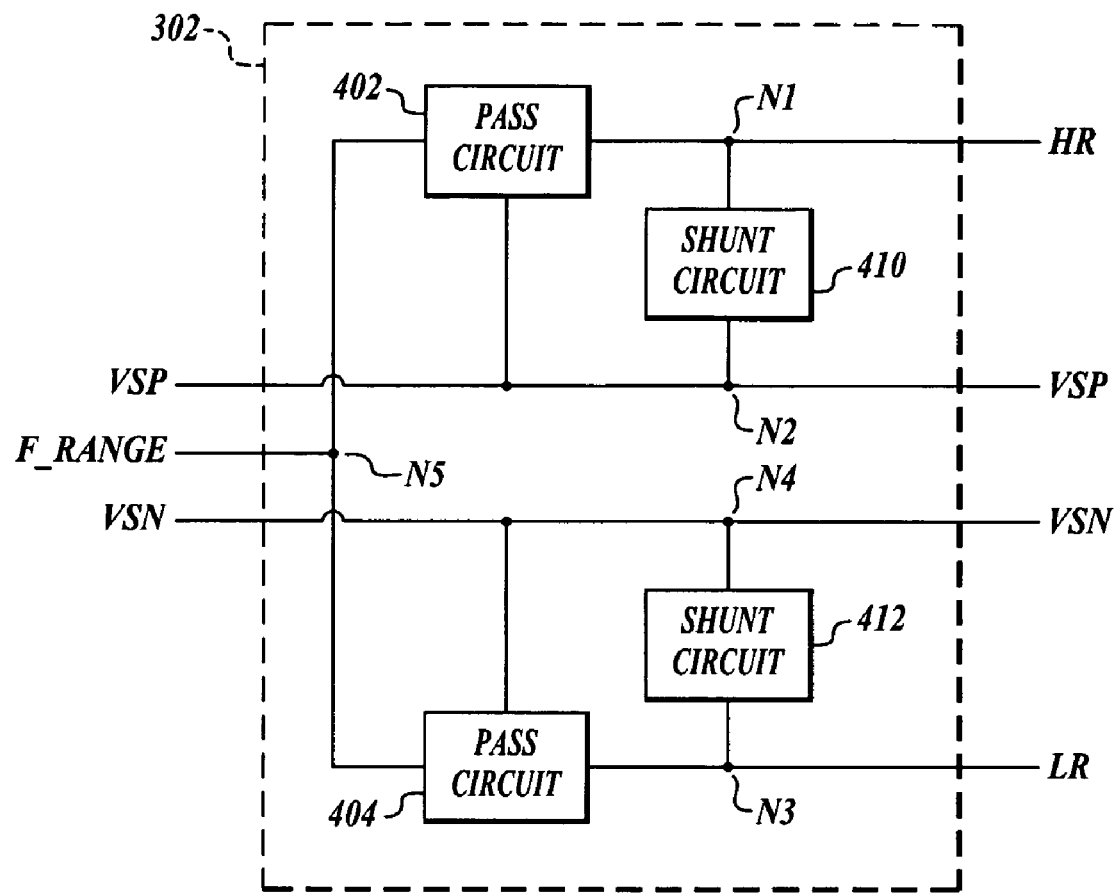
FIG. 4 illustrates an example embodiment of an input level translator circuit that is arranged in accordance with aspects of the present invention.

FIG. 4 illustrates an example embodiment of an input level translator circuit 302 that is arranged in accordance with aspects of the present invention. An example embodiment of input level translator circuit 302 includes a first pass circuit 402, a second pass circuit 404, a first shunt circuit 410, and a second shunt circuit 412.

In the embodiment of FIG. 4, the first pass circuit 402 is coupled to a full-range node N5, to a first bias node N2, and to a high-range node N1. The second pass circuit 404 is coupled to the full-range node N5, to a second bias node N4, and to a low-range node N3. The first shunt circuit 410 is coupled between the first bias node N2 and the high-range node N1. The second shunt circuit 412 is coupled between the second bias node N4 and the low-range node N3. The first bias node N2 and the second bias node N4 may coincide, or they may be different nodes.

The first pass circuit 402 is configured to provide a high-range signal hr at the high-range node in response to the full-range signal f_range. The second pass circuit 404 is configured to provide a low-range signal lr at the low-range node in response to the full-range signal f_range. The full-range signal f_range has a range from a low-voltage level to a high-voltage level. The low-range signal lr has a range from the low-voltage level to an intermediate-voltage level. The high-range signal hr has a range from the intermediate-voltage level to the high-voltage level. The intermediate voltage level is partway between the low-voltage level and the high-voltage level.

In an example input level translator circuit 302, the first shunt circuit 410 is configured to influence a resistance between the first bias node N2 and the high-range node N1, depending on a full-range signal f_range. In the particular embodiment of FIG. 4, the first shunt circuit 410 is configured to isolate the first bias node N2 from the high-range node N1 when the full-range signal f_range corresponds to a first logic level, and to short them when the full-range signal corresponds to a second logic level. The first shunt circuit 410 is configured to receive a p-type cascode signal at the first bias node, where the p-type cascode signal is appropriate for biasing a cascode transistor.

The second shunt circuit 412 is configured to influence a resistance between the second bias node N4 and the low-range node N3 depending on the full-range signal f_range. In the particular embodiment of FIG. 4, the second shunt circuit 412 is configured to short the low-range node N3 to the second bias node N4 when the full-range signal f_range corresponds to the second logic level, and to isolate them when the full-range signal f_range corresponds to the first logic level. The second shunt circuit 412 is configured to receive an n-type cascode bias signal at the second bias node.

A particularly desirable aspect of the invention is that it ensures that at least one of the high-range node N1 and the low-range node N3 are driven at least some of the time. This may be implemented in any number of ways. In the embodiment of FIG. 4, the high-range node N1 is driven by the first shunt circuit 410 when not being isolated from node N2. And the low-range node N3 is driven by the second shunt circuit 412 when not being isolated from node N4.

Figure 5:
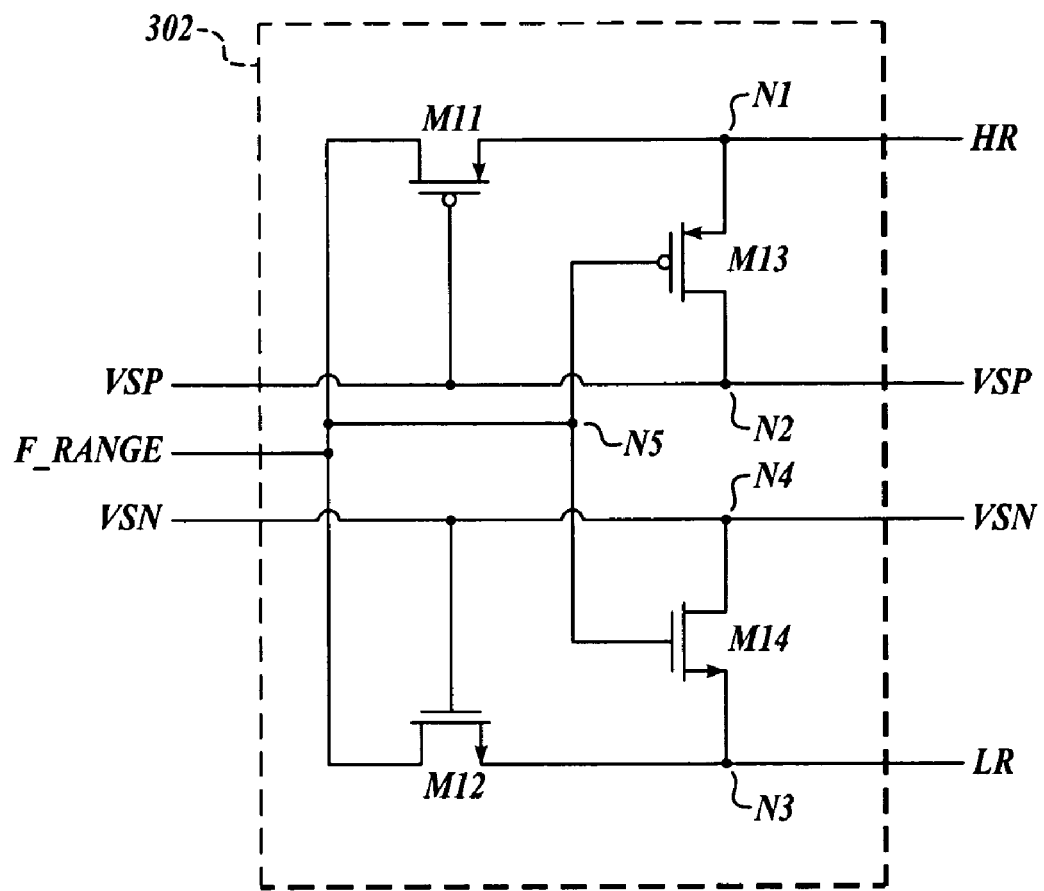
FIG. 5 illustrates another example embodiment of an input level translator circuit that is arranged in accordance with aspects of the present invention.

FIG. 5 illustrates another example embodiment of an input level translator circuit 302 that is arranged in accordance with aspects of the present invention. The example embodiment of input level translator circuit 302 illustrated in FIG. 3 includes transistors (M11–M14).

Transistor M11 has a gate that is coupled to node N2, a drain that is coupled to node N5, and a source that is coupled to node N1. Transistor M12 has a gate that is coupled to node N4, a drain that is coupled to node N5, and a source that is coupled to node N3. Transistor M13 has a gate that is coupled to node N5, a drain that is coupled to node N2, and a source that is coupled to node N1. Transistor M14 has a gate that is coupled to node N5, a drain that is coupled to node N4, and a source that is coupled to node N3.

In operation, input level translator circuit 302 is configured to provide a high-range signal hr at node N1 and a low-range signal lr at node N3 in response to a full-range signal f_range at node N5, a first shield (bias) signal Vsp at node N2, and a second shield (bias) signal Vsn at node N4.

Transistors M13 and M14 are each configured to operate as switches. Transistor M13 is arranged to provide signal Vsp at node N1 when signal f_range corresponds to logic 1. Transistor M14 is arranged to provide signal Vsn at node N3 when signal f_range corresponds to logic 0.

Transistor M11 is configured to operate as a pass gate when signal f_range corresponds to logic 0. When signal f_range corresponds to logic 0, transistor M11 provides a voltage-restricted version of signal f_range at node N1, such that the voltage is restricted between Vdda and approximately Vsp+Vtp. In operation, the value of Vsp is approximately equivalent to one half of Vdda.

Similarly, transistor M12 is configured to operate as a pass gate when signal f_range corresponds to logic 1. When signal f_range corresponds to logic 1, transistor M12 provides a voltage-restricted version of signal f_range at node N3, such that the voltage is restricted between gnd and approximately Vsn+Vtn. In operation, the value of Vsn is approximately equivalent to one half of Vdda.

Transistor M13 is configured to ensure that node N1 is never floating, and transistor M14 is configured to ensure that node N3 is never floating, even at power-up time. Transistor M13 is configured to prevent capacitive coupling from adjacent signals from a gate-to-drain capacitance (e.g. of transistor M7) from driving node N1 outside of the safe operating range. Similarly, transistor M14 is configured to prevent capacitive coupling from adjacent signals from a gate-to-drain capacitance (e.g. of transistor M8) from driving node N3 outside of the safe operating range.

Circuit 302 may be used to provide signal hr and signal lr for driving a high-voltage digital logic circuit, as described with regard to FIG. 1. Alternatively, circuit 302 may be used with an analog circuit. According to one example, circuit 302 may be used to restrict the voltage range on the gate of a transistor in an amplifier in which the voltage range of the amplifier is larger than the maximum safe value of Vgs or Vgd. According to another example, circuit 302 may be used to restrict the voltage range on the gate of a transistor in a comparator in which the voltage range of the comparator is larger than the maximum safe value of Vgs or Vgd.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. An input level translator circuit comprising:

a first pass circuit that is coupled to a full-range node, to a first bias node, and to a high-range node;

a second pass circuit that is coupled to the full-range node, to a second bias node, and to a low-range node;

a first shunt circuit that is coupled between the first bias node and the high-range node; and a second shunt circuit that is coupled between the second bias node and the low-range node, wherein the first shunt circuit comprises a transistor that has:

a gate that is coupled to the full-range node, a source that is coupled to the high-range node, and a drain that is coupled to the first bias node.

2. The input level translator circuit of claim 1, wherein the second shunt circuit comprises a transistor that has:

a gate that is coupled to the full-range node, a source that is coupled to the low-range node, and a drain that is coupled to the second bias node.

* * * * *